(12) United States Patent
Cerofolini et al.

(10) Patent No.: US 7,928,578 B2
(45) Date of Patent: Apr. 19, 2011

(54) ELECTRIC LINKAGE IN A SEMICONDUCTOR ELECTRONIC DEVICE BETWEEN A NANOMETRIC CIRCUIT ARCHITECTURE AND STANDARD ELECTRONIC COMPONENTS

(75) Inventors: Gianfranco Cerofolini, Milan (IT); Danilo Mascolo, Ercolano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/568,508

(22) Filed: Sep. 28, 2009

(65) Prior Publication Data
US 2010/0019389 A1 Jan. 28, 2010

Related U.S. Application Data

(62) Division of application No. 11/482,513, filed on Jul. 7, 2006, now Pat. No. 7,605,066.

(30) Foreign Application Priority Data

Jul. 8, 2005 (EP) .................................... 05425489

(51) Int. Cl.
*H01L 23/48* (2006.01)
(52) U.S. Cl. ................ 257/773; 257/774; 257/E21.023; 257/E23.011; 257/E23.141; 438/584; 977/762
(58) Field of Classification Search .......... 438/584–688; 257/773, E23.141, E23.152, E21.495, E21.023, 257/E21.582, 774, E23.011; 977/700, 762, 977/742

See application file for complete search history.

(56) References Cited

U.S. PATENT DOCUMENTS

| | | | |
|---|---|---|---|
| 4,994,410 A | 2/1991 | Sun et al. | |
| 5,963,827 A | 10/1999 | Enomoto et al. | |
| 6,128,214 A | 10/2000 | Kuekes et al. | |
| 6,256,767 B1 | 7/2001 | Kuekes et al. | |
| 6,268,657 B1 | 7/2001 | Watanabe et al. | |
| 6,407,443 B2 * | 6/2002 | Chen et al. | 257/616 |
| 6,548,881 B1 | 4/2003 | Blish et al. | |
| 6,984,294 B2 | 1/2006 | Friedemann et al. | |
| 7,230,286 B2 | 6/2007 | Cohen et al. | |
| 7,276,424 B2 * | 10/2007 | Wei | 438/406 |

(Continued)

OTHER PUBLICATIONS

N. A. Melosh et al., "Ultrahigh-Density Nanowire Lattices and Circuits," Science, vol. 300, Apr. 4, 2003, pp. 112-115.

(Continued)

*Primary Examiner* — Khiem D Nguyen
(74) *Attorney, Agent, or Firm* — Lisa K. Jorgenson; E. Russell Tarleton; Seed IP Law Group PLLC (57) ABSTRACT

A semiconductor electronic device that includes a semiconductor substrate having a top surface; a seed layer positioned on the substrate and having a notched wall extending transversely with respect to the substrate top surface, the wall defining a first recess extending into the seed layer with a height equal to a thickness of the seed layer; a first conductive nanowire in contact with the notched wall, the first conductive nanowire having a contact portion extending into the first recess and covering opposite sidewalls and a bottom of the first recess; a first insulating nanowire in contact with a sidewall of the first conductive nanowire; an insulating layer on the contact portion of the first conductive nanowire and having a first window substantially in correspondence with the contact portion of the first conductive nanowire; and a first conductive die on the insulating layer that includes a conductive contact extending into the first window and contacting the contact portion of the first conductive nanowire.

43 Claims, 7 Drawing Sheets

U.S. PATENT DOCUMENTS

2002/0163086 A1* 11/2002 Toyoda .................. 257/773
2003/0085439 A1    5/2003 Gudesen et al.
2005/0052894 A1*  3/2005 Segal et al. ................ 365/129

OTHER PUBLICATIONS

A. Dehon et al., Stochastic Assembly of Sublithographic Nanoscale Interfaces, IEEE Transactions on Nanotechnology. vol. 2, No. 3, Sep. 2003, pp. 165-174.

S. R. Sonkusale et al., Fabrication of wafer scale, aligned sub-25 nm nanowire and nanowire templates using planar edge defined alternate layer process, Physica E, vol. 28 (2005), pp. 107-114.

G.F. Cerofolini et al., A hybrid approach to nanoelectronics, Nanotechnology, vol. 16 (2005), pp. 1040-1047.

M.D. Austin et al., 6 nm half-pitch lines and 0.04 Mum2 static random access memory patterns by nanoimprint lithography, Nanotechnology, vol. 16 (2005), pp. 1058-1061.

* cited by examiner

ELECTRIC LINKAGE IN A SEMICONDUCTOR ELECTRONIC DEVICE BETWEEN A NANOMETRIC CIRCUIT ARCHITECTURE AND STANDARD ELECTRONIC COMPONENTS

BACKGROUND

1. Technical Field

The present disclosure relates, in its most general aspect, to the field of electronic circuits and in particular to the field of the electronic circuits comprising components of nanometric sizes.

More specifically, the present disclosure relates to a circuit of the above type, a plurality of electric contacts between elements of nanometric sizes (nanowires) defining the above circuit architectures of a nano-area, and standard electronic components of a micro-area.

2. Description of the Related Art

In such field, an electronic circuit integrated in a semiconductor device can be schematically represented by one or more micrometric regions, or micro-areas, interacting with one or more nanometric regions or nano-areas.

A micro-area comprises, or is defined by, so called standard electronic components such as, for example, capacitor diodes, MOSFET transistors, address devices, logic and memory devices, micro-contacts, or portions thereof.

The sizes of such standard electronic components, usually micrometric or sub-micrometric, depend, in the last analysis, on the wavelength of the photolithographic source employed in their realization, usually not lower than 90 nm.

A nano-area comprises in turn, or is defined by, circuit architectures of nanometric sizes obtained, for example, by means of electronic lithography (e-beam lithography), with S"PT technique (Multi-Spacer Patterning Technology) or by means of imprint lithography (in all the possible versions: Soft Lithography, Nano-Imprint Lithography, Step-and-Flash Imprint Lithography, and Superlattice Nanowire Pattern).

A nano-area can possibly comprise, moreover, housed in such nanometric circuit architectures, molecular devices realized through chemical synthesis, i.e., molecules able to perform specific functions of mechanical, electric or optic nature.

As it is known, in the electronics field, the need of realizing circuit configurations of more and more reduced sizes is particularly felt.

Actually, the advent of constantly more refined technologies has allowed the miniaturization of the circuit architectures and, in consequence, a greater density thereof in the semiconductor electronic devices.

For example, it has been possible to realize, by means of non-photolithographic techniques, arrays of nanowires having a pitch in the order of a few tens of nanometers (circa 30 nm), or still crossbar architectures of nanowires having a density of intersection points of about $10^{11}$ $cm^{-2}$.

Some examples of such embodiments are reported in the publication by N. A. Melosh, A. Boukai, F. Diana, B. Gerardot, A. Badolato, and J. R. Heath, "Ultra High Density Nanowire Lattices and Circuits", Science 300, 112 (2003), and in that by M. D. Austin, W. Zhang, H. Ge, D. Wasserman, S. A. Lyon and S. Y. Chou, "6 nm half-pitch lines and 0.04 µm2 static random access memory patterns by nanoimprint lithography", Nanotechnology, 16 (2005). A further embodiment is disclosed in the U.S. Pat. No. 6,128,214 by P J. Kuekes et al.

However, although currently the capacity to obtain nanometric architectures having the above sizes is widespread, the realization of semiconductor devices comprising such architectures has mainly interested, up to now, the experimental aspect.

The substantial absence of a production of such electronic devices on an industrial scale, is mainly due to the difficulty of relating nanometric architectures to standard electronic components, i.e., of realizing a connection interface between nano-area and micro-area of the electronic device.

Although some methods have been developed for the realization of the above connection, as it is reported, for example, in the U.S. Pat. No. 6,256,767 by Kuekes et al. and in the publication by A. DeHon, P. Lincoln and J. E. Savagein, "Stochastic assembly of sub-lithographic nanoscale interfaces", IEEE Trans. On Nanotec. 2 (3), 165174, (September 2003), such methods are not reliable and industrially profitable.

It would be thus desirable to have a method at disposal for realizing an electric connection between standard electronic components of a micro-area and nanometric electronic components of a nano-area, which is particularly simple, reliable and in line with the currently used technology for realizing circuit configurations of more and more reduced sizes.

Such a method would allow an industrialization on a large scale of high density integrated electronic circuits in a semiconductor substrate.

BRIEF SUMMARY

One embodiment of the present disclosure provides an integrated electronic device of the above considered type, an electric connection between a nanometric circuit architecture and standard electronic components which overcomes the above drawbacks and those still affecting the methods according to the prior art.

The characteristics and the advantages of the present disclosure will be apparent from the following description of some embodiments given by way of indicative and non-limiting example with reference to the annexed drawings.

In accordance with one embodiment of the present disclosure, a semiconductor electronic device is provided that includes a semiconductor substrate having a top surface; a seed layer positioned on the substrate and having a notched wall extending transversely with respect to the substrate top surface, the wall defining a first recess extending into the seed layer with a height equal to a thickness of the seed layer; a first conductive nanowire in contact with the notched wall, the first conductive nanowire having a contact portion extending into the first recess and covering opposite sidewalls and a bottom of the first recess; a first insulating nanowire in contact with a sidewall of the first conductive nanowire; an insulating layer on the contact portion of the first conductive nanowire and having a first window substantially in correspondence with the contact portion of the first conductive nanowire; and a first conductive die on the insulating layer that includes a conductive contact extending into the first window and contacting the contact portion of the first conductive nanowire.

DETAILED DESCRIPTION

The here described steps do not form a complete flow of a method for realizing an electric connection in a semiconductor electronic device between a nanometric circuit architecture and standard electronic components and only those steps needed by an average technician of the field for the comprehension of the invention are hereafter described.

It is important to note, moreover, that the figures represent schematic views of portions of an electronic circuit integrated in a semiconductor device during some steps of a method according to one embodiment of the invention, and they are not drawn to scale, but, on the contrary, realized in such a way as to stress the characteristics of one embodiment of the invention.

The present invention can be implemented by using several techniques usually used in the manufacturing of semiconductor electronic devices, in particular all the lithographic methodologies (optical lithography, UV, EUV, electronic, ionic, imprint) and the Multi Spacer Patterning Technology (S"PT).

In particular, this latter technology is employed to realize nanowires of a nanometric circuit architecture, which is electrically connected to standard electronic components of a micro-area.

Although known, for a better comprehension of the invention, the peculiar aspects of the S"PT through which, advantageously, it is possible to realize the above nanometric circuit architectures with extreme precision and control are hereafter briefly summarized.

More in particular it is possible to realize circuit architectures comprising arrays of high density nanowires in the semiconductor device.

The S"PT (reiteration of the Space Patterning Technique SPT) is a technique which allows to transform the thickness of a thin layer of a predetermined material (vertical dimension), deposited on a substrate, into the width of a spacer or more generically of a nanowire, of the same material (horizontal dimension).

Such technique exploits the possibility of controlling, in a more precise way, the thickness of the deposited layer, as well as the capacity that a lot of materials have to adapt uniformly to the topography underlying them.

The possibility of transforming a vertical dimension or extension into a horizontal one is allowed by the initial use of a seed (sacrificial layer), provided with at least a vertically extended wall, whereon the material is deposited.

Further to an anisotropic etching of the deposited layer the nanowire, adjacent to the above vertical wall, is obtained comprising in turn a vertically extended wall, wherefrom, by reiterating the process, further nanowires can be obtained.

Finally, the capacity of selectively removing different materials allows to obtain, subsequently to further controlled depositions and anisotropic etchings, variously complex structures.

In practice, it is possible to realize a circuit architecture wherein only one dimension depends on the photolithography, whereas the remaining two dimensions (width and height of the nanowire) are obtained by controlling the thickness of the deposited layer, even within a few nanometers.

Deposited layer, as it is known herein, means a layer obtained both by means of a real controlled deposition of the material, for example with "CVD oxide" (Control Vapor Deposition), and by means of the growth of the material from the underlying layer, for example by means of "Thermal Oxidation".

Now, with reference to the above figures, A indicates a portion of a substrate of a semiconductor device whereon an integrated circuit is realized.

Figure 1:
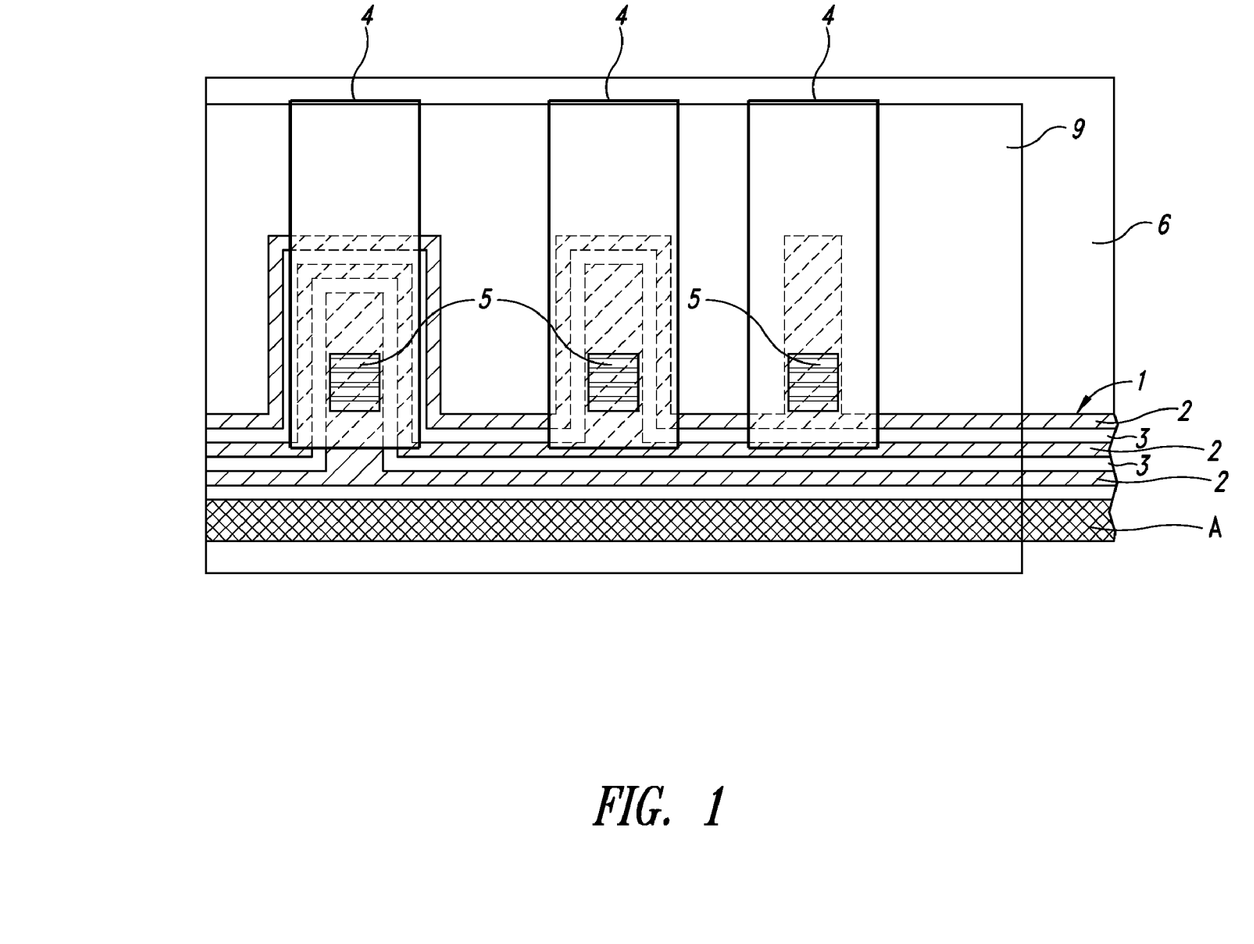
FIG. 1 schematically shows a plan and partially section view of a portion of a semiconductor electronic device comprising an electric connection between a nanometric circuit architecture and standard electronic components, realized with the method according to one embodiment of the invention.

In detail, on the substrate A there is a nanometric circuit structure 1 comprising n conductive nanowires 2 (in the embodiment of the figures three conductive nanowires), arranged according to an ordered configuration, alternated with insulating nanowires 3 (FIG. 1). It should be appreciated that FIG. 1 is a plan and partially section view in that the substrate A is at a lower level than the nanowires 2, 3 which are formed on covered portions of the substrate A.

The above nanowires, and more generally the nanometric circuit architecture 1, constitute, or in the semiconductor electronic device are part of, a so called nano-area, which is electrically connected, through conductive dies 4, to standard electronic components, these latter being not shown in the figures.

The dies 4 in turn constitute, or with the above standard electronic components are part of, a so called micro-area of the semiconductor electronic device.

The electric connection between nano-area and micro-area is realized by a plurality of electric contact areas, or simply contacts 5, between the nanowires 2 and the dies 4.

Figure 2:
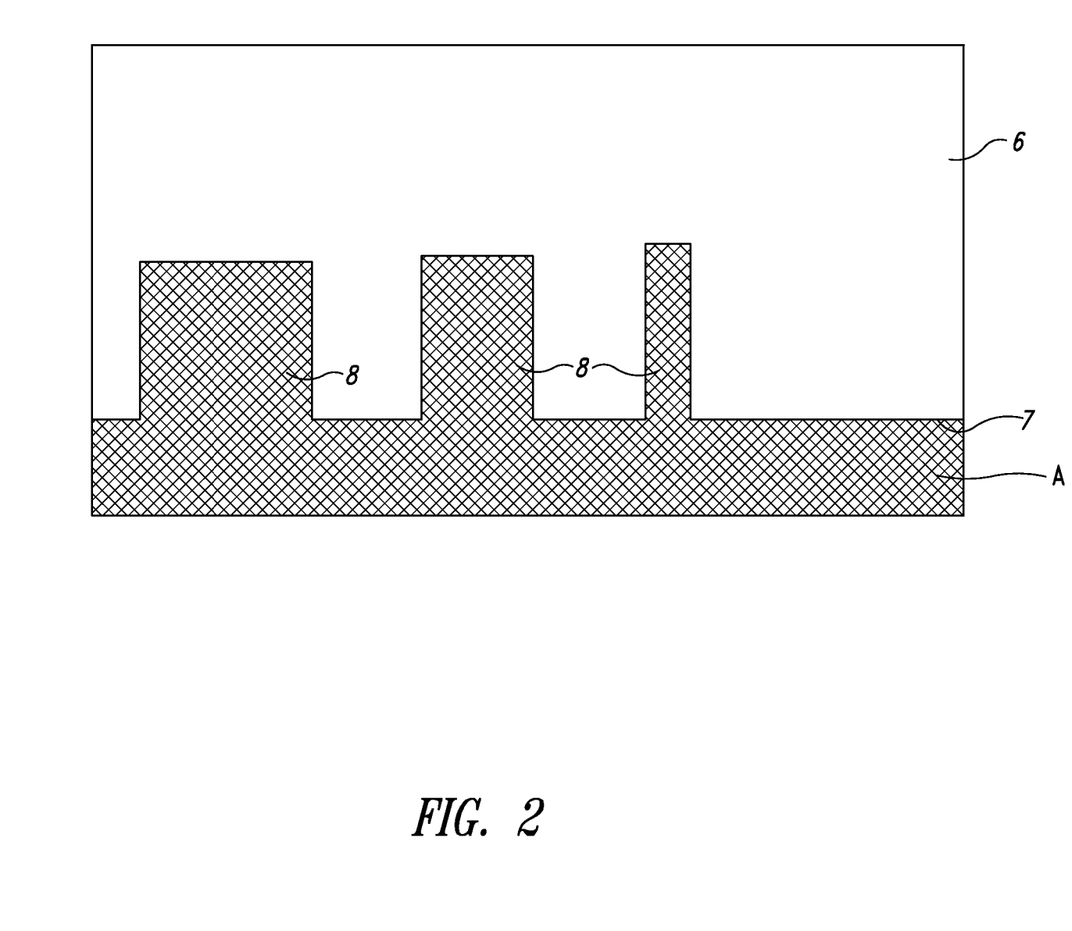
FIGS. 2 to 7 show a portion of a semiconductor electronic device during some steps of a method according to one embodiment of the invention with relevant enlarged details, for realizing the electric connection of FIG. 1.
Figure 3:
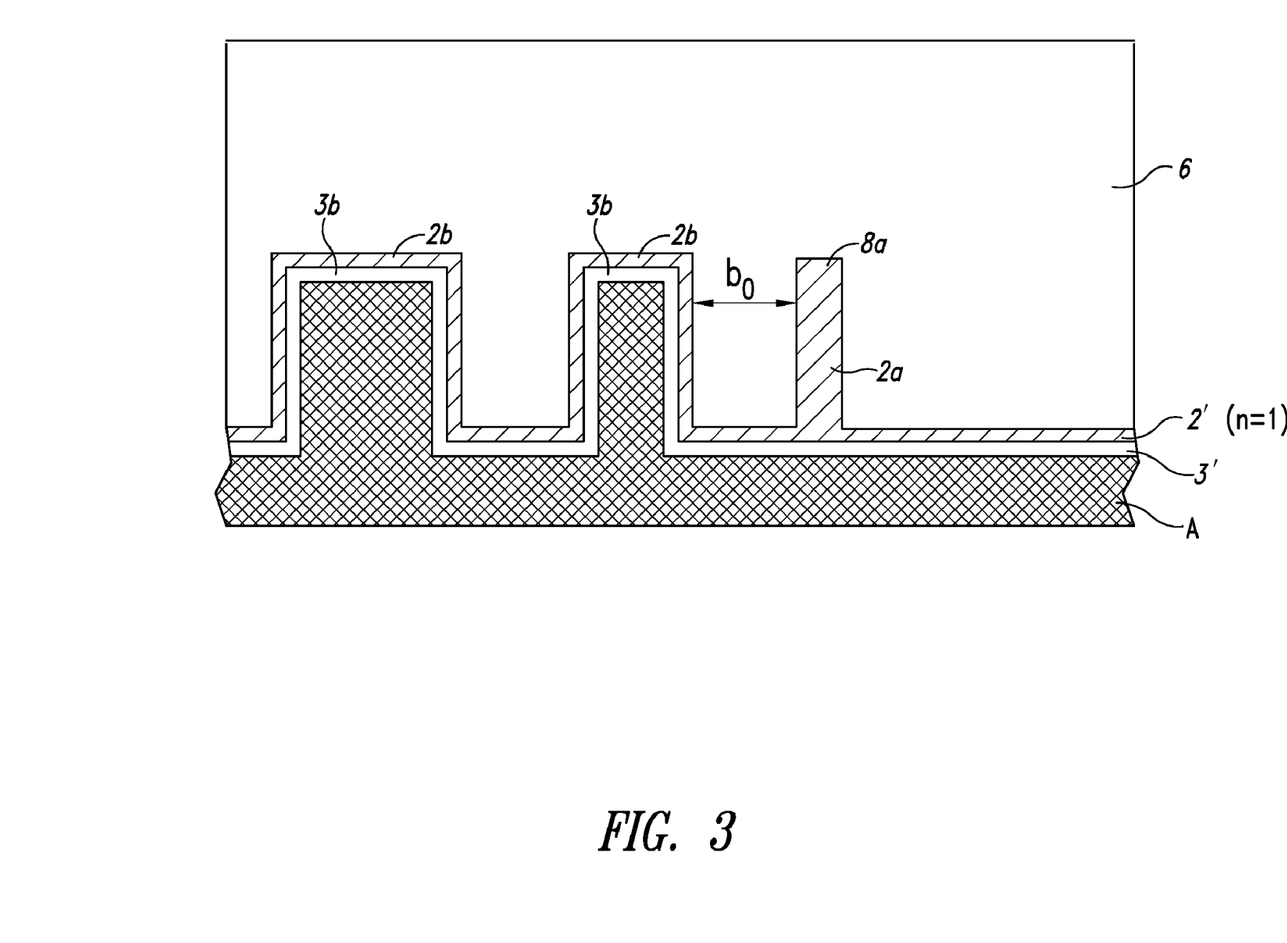

To obtain the contacts 5, the present method first provides the realization of the above n conductive nanowires 2 alternated with the insulating nanowires 3, which are obtained by means of the S"PT technique, starting from a seed layer 6 formed on the substrate A and having a vertical wall 7 extending upwardly from the substrate A, as shown in FIG. 2. The vertical wall 7 is crossed by n recesses 8 and is substantially perpendicular to the substrate A. The n recesses 8 can be formed in the seed layer 6 by any of the photolithographic techniques discussed above.

In particular, the recesses 8 extend towards the inside of the seed layer 6 for the whole vertical extension of the seed layer itself which, moreover, in correspondence with such vertical wall 7 has a notched, or comb-like, profile.

The recesses 8, preferably parallel to each other, are placed at a constant distance $b_0$ from one another, whereas the depth and the width of each nth recess are correlated with the thickness $t_{si}$ of the conductive nanowires 2 and with the thickness $(t_{sp}-t_{si})$ of the insulating nanowires 3 and are given by the relations $a_n \geqq (n-1)t_{sp}+a_0$ and $b_n=2t_{si}+2(n-1)t_{sp}$ respectively, where $a_0$ is a constant dependant on the technique employed in the realization of the seed layer 6, as it will be more apparent hereafter in the description.

A first one 2' of the n conductive nanowires 2 is realized by first depositing a conductive layer, preferably polysilicon, on the substrate A and the seed layer 6, thereby also at least partially filling the recesses. Next, the conductive layer is anisotropically etched to remove the conductive layer from the horizontal surfaces of the seed layer 6 and substrate A, while leaving the first conductive nanowire 2' on the vertical surface 7 of the seed layer 6. After the anisotropic etching, the conductive layer also remains on the walls of the recesses 8. A first one 8a of the recesses 8 is made sufficiently narrow so that the anisotropic etching does not remove the conductive layer in the first recess 8a, thereby forming an elbow-like portion 2a in the first recess. The other recesses 8 are sufficiently wide such that notched profile portions 2b of the nanowire 2' remain in those recesses 8.

After the first conductive nanowire 2' is formed, a first one 3' of the n insulating nanowires 3 is formed in a similar manner as the first conductive nanowire 2'. A dielectric layer is first formed on the first conductive nanowire 2', the seed layer 6, and the substrate A and then anisotropically etched to leave the first insulating nanowire 3' on the outside vertical wall of the first conductive nanowire 2'. The first insulating nanowire 3' includes notched profile portions 3b formed on the vertical sidewalls of the notch profile portions 2b of the first conductive nanowire 2'. Preferably, the dielectric layer is a thermal silicon oxide layer that is thermally grown on the underlying layers such that the first insulating nanowire 3' is oxide.

Figure 4:
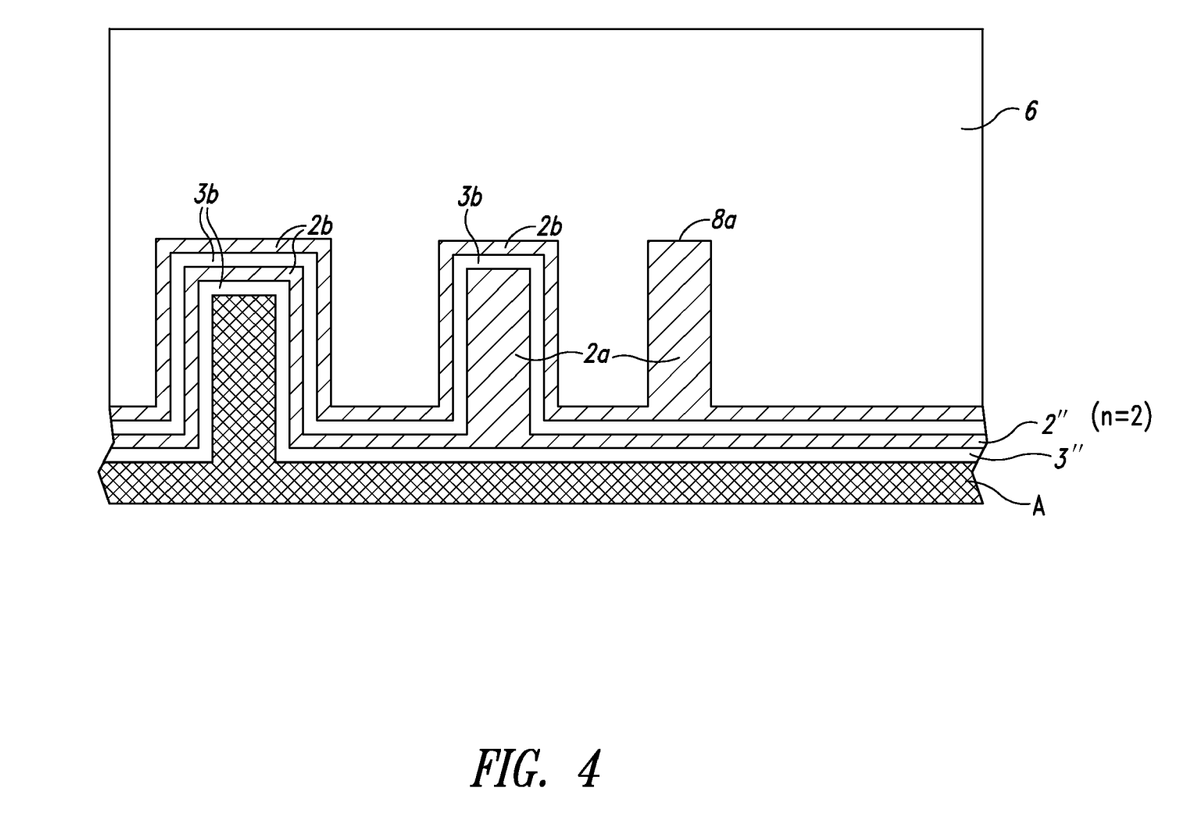
Figure 5:
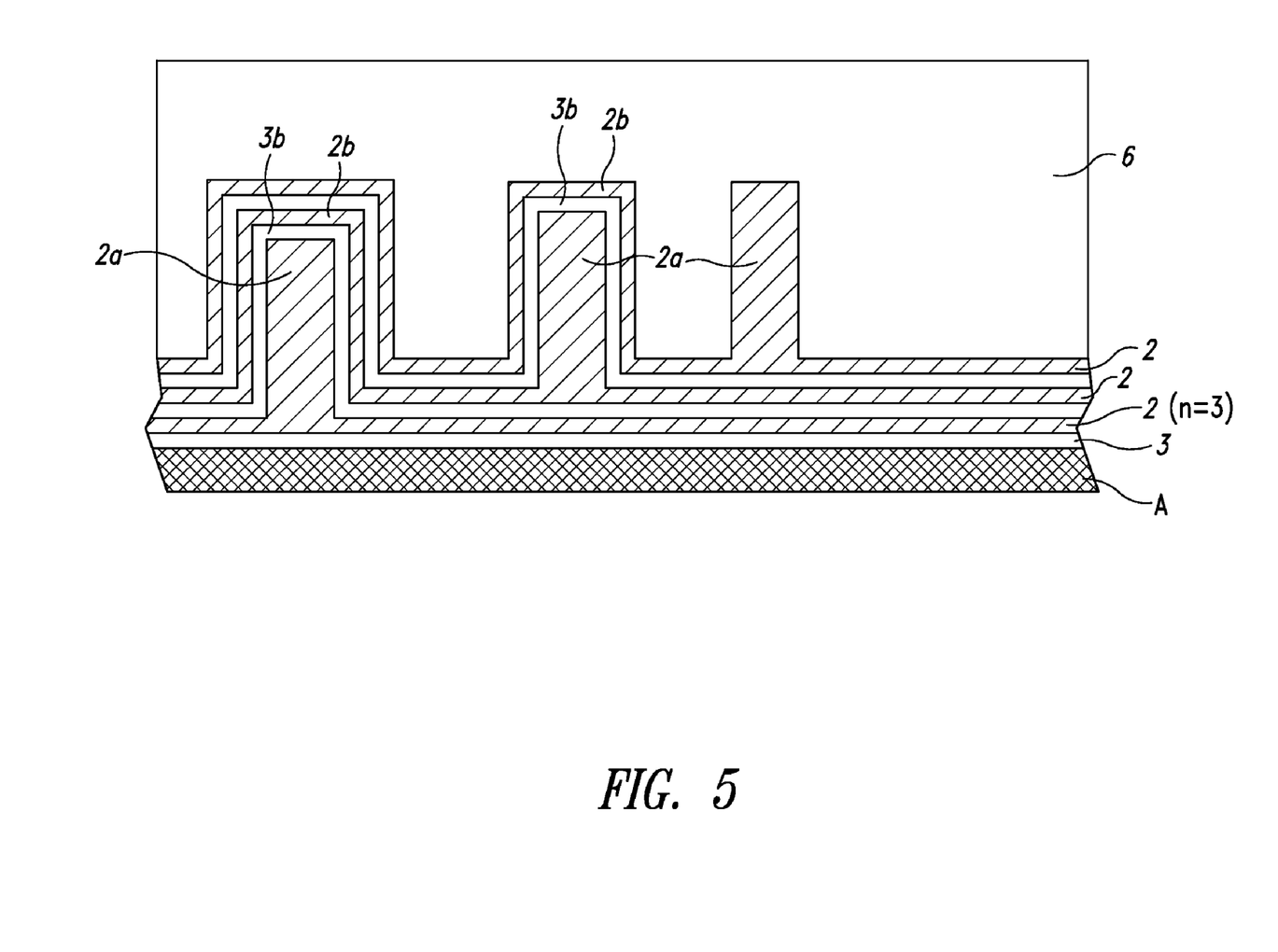
Figure 6:
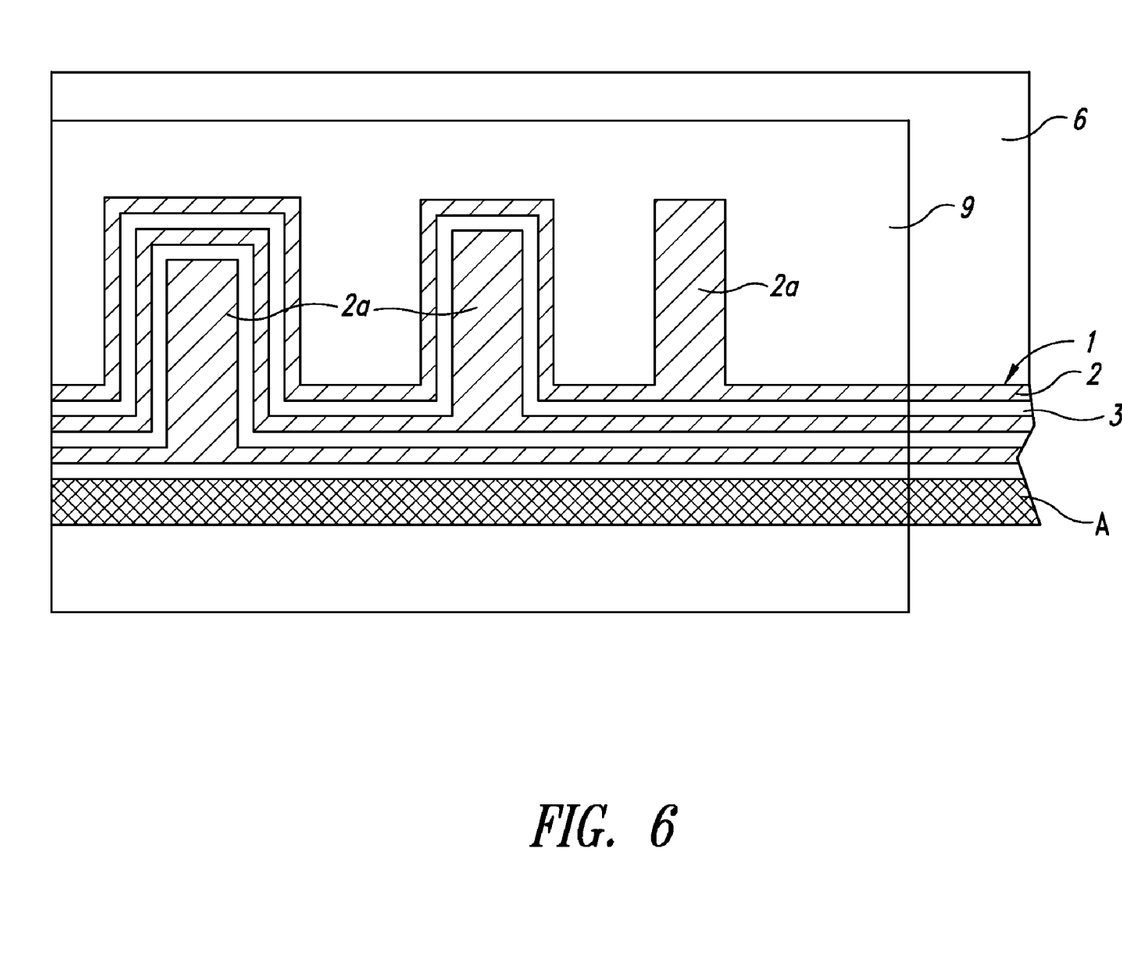
Figure 7:
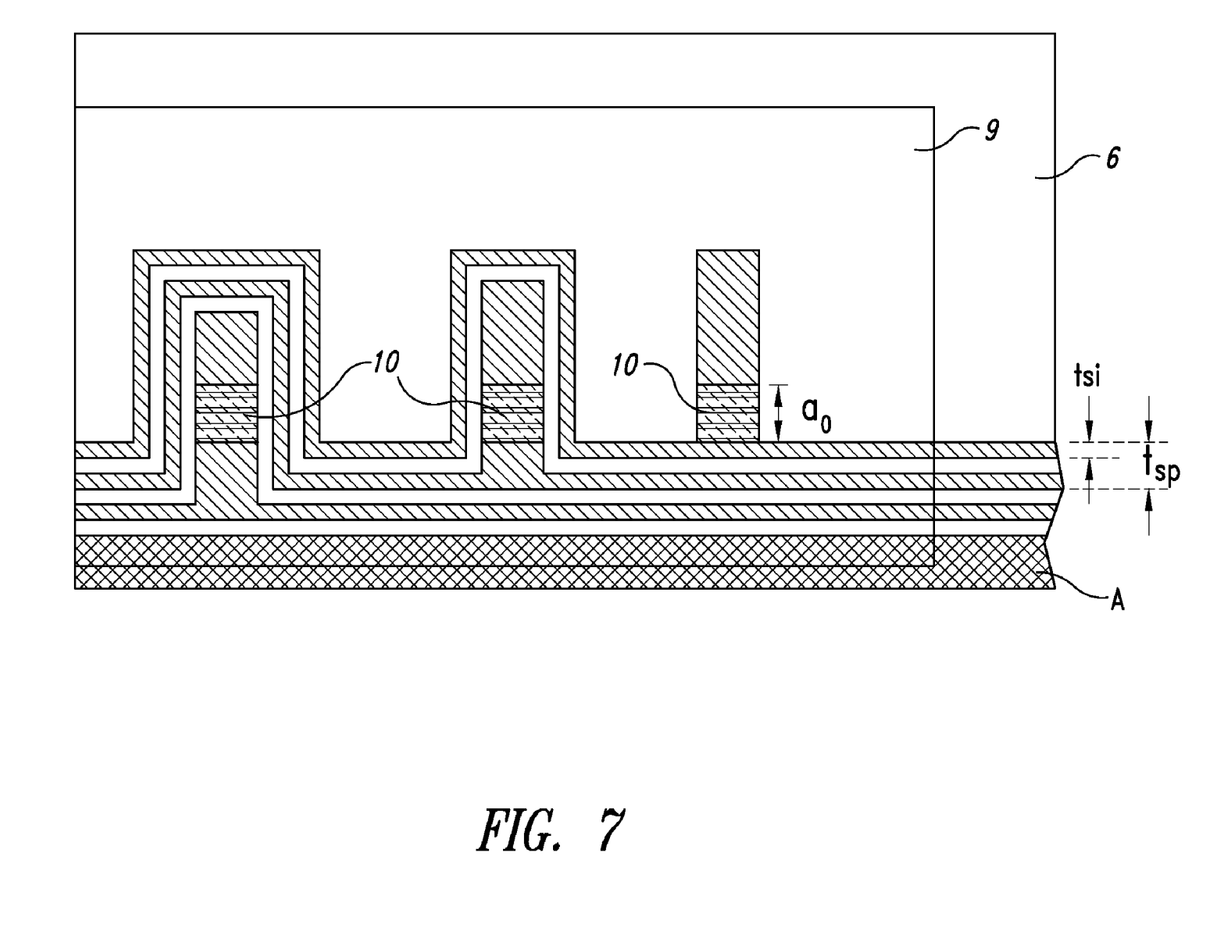

The S"PT technique repeats the above steps to form the remaining conductive nanowires 2 and insulating nanowires 3, as shown in FIGS. 4-5. The n conductive nanowires 2 are each thus realized with the thickness $t_{si}$ comprised between 5 nm and 60 nm preferably between 5 nm and 30 nm, by means of the controlled deposition, on the seed layer 6 and the substrate A, of a layer of conductive material having such thickness, preferably a polysilicon layer, followed by anisotropic etching of the deposited layer.

The formation of the conductive nanowires 2 is alternated with the realization of the insulating nanowires 3 obtained according to S"PT mode by growth of a thermal oxide from the conductive material, followed in any case by anisotropic etching of the insulating material.

Each insulating nanowire 3 is realized with the thickness $(t_{sp}-t_{si})$ wherein $t_{sp}$ is the width, or thickness, of a pair of consecutive conductive 2 and insulating 3 nanowires and is lower than 90 nm, preferably comprised in the range 10-50 nm.

In this way, i.e., meeting the above relations, the realization of a conductive nanowire 2 of order n implies, as effect, the completion of the filling of the corresponding nth recess 8 of width $b_n$.

Going on with the realization of the nanowires, as it can be seen in FIG. 4, it follows that for n=2 the realization of the second conductive nanowire 2" implies the completion of the filling of the recess 8 of second order by means of a respective elbow-like portion 2a, and a further partial filling, by means of respective portions with notched profile 2b, of the recesses 8 of greater order than the second. A second one 3" of the insulating nanowires 3 is then formed as discussed above on the vertical walls of the second conductive nanowire 2".

More in general, this mechanism is repeated at each realization of a conductive nanowire of a given order, with the effect of determining the filling or the completion of the filling of a recess 8 of the same order by means of a respective elbow-like portion 2a, and the partial filling together with the conductive 2 and insulating 3 nanowires of lower order, already realized, of the recesses 8 of greater order by means of respective notched profile portions 2b, 3b.

The above nanometric circuit architecture 1 is thus obtained, and then an insulating layer 9 is realized on the nanometric circuit architecture 1.

Such insulating layer 9 is preferably a silicon oxide layer whose thickness is comprised between 1 nm and 100 nm. However, for the realization of such layer also different materials can be employed such as, for example, silicon nitride and similar insulating materials.

At this point, n windows 10 are opened on the insulating layer 9, each window 10 being open essentially in correspondence with a respective one of the recesses 8 so as to expose part of the elbow-like portion 2a of the conductive nanowire 2 present in the recess.

In this way, each window 10 selectively exposes a conductive nanowire 2 in its elbow-like portion 2a which advantageously has a length longer than $t_{si}$, i.e., accessible by means of electronic lithography or other lithographic techniques of new generation.

The opening of the above windows 10 can be performed, for example, with electronic lithography in a conventional way, or by bombing the insulating layer 9 with an ionic beam according to the technology known as FIB.

In this respect, it is to be noted that for the selective opening of the windows 10 in correspondence with the respective elbow-like portions 2a of the conductive nanowires 2 is sufficient to align a mask with the seed layer 6 whose position is identified, the mask having respective openings suitably placed in relation to the predetermined distance $b_0$ between the recesses 8 of the seed 6, and suitably sized in relation to the width $a_0$ desired for the windows 10.

As previously remembered, $a_0$ is in turn linked to the technology used for realizing the seed layer 6 and preferably corresponds to the smallest size definable with the technology.

In particular, according to the technology used, $a_0$ is comprised between 2 nm and 60 nm, preferably between 5 nm and 20 nm, whereas $b_0$ is typically lower than 60 nm, preferably comprised between 10 nm and 30 nm.

At this point, on the insulating layer 9 in correspondence with the windows 10, the above conductive dies 4 are realized.

In detail, the dies 4 are realized in such a way as to overlap, in correspondence with the window 10, onto a respective exposed part of the elbow-like portion 2a of a conductive nanowire 2, with obtainment of the above contacts 5, and realization of the desired electric connection between nano-area and micro-area.

Moreover, it is to be the that the dies 4 are advantageously realized according to conventional methodologies by depositing, on the insulating layer 9 whereon the windows 10 have been opened, a layer of conductive material, this latter not shown in the figures, and by defining it by means of photolithography.

The conductive material can be doped polysilicon deposited by means of CVD techniques or metal deposited by means of PVD.

As regards the realization of the above seed layer 6, it can be obtained in a conventional way with various technologies, in particular with S"PT technique or with lithographic methods such as extreme ultraviolet lithography EUV, deep ultraviolet lithography DUV, electronic e-beam lithography and the imprint lithography in all its possible versions (Soft Lithography, Nano-imprint Lithography, Step-and-Flash Imprint Lithography, and Superlattice Nanowire Pattern).

In synthesis, relatively to the cited lithographic techniques, on the above substrate A first a layer of sacrificial material is deposited (for example a nitride, an oxide etc.) and then a resist layer is deposited on the layer of sacrificial material. At this point the resist layer is defined by means of a mask according to the desired profile for the seed layer 6 by using one of the above technologies.

Then, the sacrificial material exposed by the above definition is removed, i.e., the portion is no longer masked by the resist, with obtainment of the seed layer 6.

With the present method, in practice, an electric connection is realized between the nano-area and the micro-area of the integrated electronic device by increasing the width or thickness of each nanowire in correspondence with respective elbow-like portions suitably spaced from one another and being selectively accessible.

In particular, the above increase makes the nanowires 2 singularly and directly accessible for the electric connection to standard electronic components, for example micro-contacts, by means of the techniques currently used in the realization of semiconductor electronic devices, employed for realizing the conductive dies 4.

The main advantage of the method described above lies in the possibility of selectively contacting high density conductive nanowires of a nanometric circuit architecture, whose width and whose distance are below the lowest limit attainable by means of lithography.

A further advantage lies in the simple realization of the method described above, which provides steps which can be easily integrated in the currently used manufacturing processes.

Moreover, the present method has revealed to be particularly profitable from the economic point of view.

Obviously, in order to meet contingent and specific requirements, a skilled in the art could bring several modifications to the above described invention, all however comprised within the scope of protection of the invention, as defined by the following claims.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor electronic device, comprising:
   a semiconductor substrate having a top surface;
   a seed layer positioned on the substrate, the seed layer having a notched wall extending transversely with respect to the top surface of the substrate, the wall defining a first recess extending into the seed layer and having a height equal to a thickness of the seed layer;
   a first conductive nanowire in contact with the notched wall, the first conductive nanowire having a contact portion that extends into the first recess and covers opposite sidewalls and a bottom of the first recess;
   a first insulating nanowire in contact with a sidewall of the first conductive nanowire;
   an insulating layer on the contact portion of the first conductive nanowire, the insulating layer having a first window substantially in correspondence with the contact portion of the first conductive nanowire; and
   a first conductive die on the insulating layer, the first conductive die including a conductive contact that extends into the first window and contacts the contact portion of the first conductive nanowire.

2. The device of claim 1, wherein the notched wall defines a second recess extending into the seed layer and having a height equal to the thickness of the seed layer, the first conductive nanowire extends into the second recess and contacts sidewalls of the second recess, and the second insulating nanowire extends into the second recess and contacts sidewalls of the first conductive nanowire.

3. The device of claim 2, further comprising:
   a second conductive nanowire in contact with a sidewall of the first insulating nanowire, the second conductive nanowire having a contact portion that extends into the second recess and fills the second recess, the insulating layer being formed on the contact portion of the second conductive nanowire, wherein the insulating layer has a second window substantially in correspondence with the contact portion of the second conductive nanowire;
   a second insulating nanowire in contact with a sidewall of the second conductive nanowire; and
   a second conductive die on the insulating layer, the second conductive die including a conductive contact that extends into the second window and contacts the contact portion of the second conductive nanowire.

4. The device of claim 3, wherein the first and second recesses are spaced apart by a distance comprised between 10 nm and 30 nm.

5. The device of claim 1, wherein the contact portion of the first nanowire has a width comprised between 2 nm and 60 nm.

6. The device of claim 1, wherein the first window has a width comprised between 2 nm and 60 nm.

7. An electric device between a nanometric circuit architecture and standard electronic components, the device comprising:
   a) a semiconductor substrate and a seed layer having at least a notched wall substantially perpendicular to the substrate, the wall defining n vertical recesses having a height equal to a thickness of the seed layer, the recesses placed at a distance $b_0$ from one another and having depth $a_n$ and width $b_n$;
   b) n conductive nanowires of thickness $t_{si}$ alternated with insulating nanowires of thickness $(t_{sp}-t_{si})$ wherein $t_{sp}$ is a width of a pair of the conductive and insulating nanowires and, at each realization of one of the conductive nanowires of a given order n, a filling of a corresponding one of the recesses of the same order by a respective elbow-like portion of the conductive nanowire, and a partial filling together with the conductive and insulating nanowires of lower order, of the recesses of greater order by means of respective notched profile portions that form the nanometric circuit architecture;
   c) an insulating layer formed above the nanometric circuit architecture;
   d) n windows in the insulating layer, each window open substantially in correspondence with a respective one of the recesses, with exposure of at least part of the elbow-like portion of a respective one of the conductive nanowires present in the recess; and
   e) n conductive dies formed above the insulating layer and addressed towards the standard electronic components, the conductive dies respectively overlapping in correspondence with the respective windows to respective exposed parts of the respective elbow-like portions of the respective conductive nanowires with obtainment of n contacts realizing the electric connection.

8. The device of claim 7, wherein the depth $a_n$ and the width $b_n$ of the seed layer are linked to the thickness $t_{si}$ $(t_{sp}-t_{si})$ of the nanowires respectively conductive and insulating, by the relation $a_n \geq (n-1)t_{sp}+a_0$ and $b_n=2t_{si}+2(n-1)t_{sp}$.

9. The device of claim 7, wherein the n windows have size in a depth direction and in a direction of the width of the recesses equal to $a_0$.

10. The device of claim 9, wherein $a_0$ corresponds to the smallest size definable by the technique used for the opening of the windows.

11. The device of claim 9, wherein $a_0$ is comprised between 2 nm and 60 nm.

12. The device of claim 9, wherein $a_0$ is comprised between 5 nm and 20 nm.

13. The device of claim 7, wherein $b_0$ is lower than 60 nm.

14. The device of claim 13, wherein $b_0$ is comprised between 10 nm and 30 nm.

15. The device of claim 7, wherein the thickness $t_{si}$ of the conductive nanowires is comprised between 5 nm and 60 nm.

16. The device of claim 7, wherein the thickness $t_{sp}$ of the conductive nanowires is comprised between 5 nm and 30 nm.

17. The device of claim 7, wherein the thickness $t_{sp}$ of each pair of consecutive conductive and insulating nanowires is lower than 90 nm.

18. The device of claim 17, wherein the thickness $t_{sp}$ of each pair of consecutive conductive and insulating nanowires is comprised between 10 nm and 50 nm.

19. The device of claim 7, wherein the conductive nanowires are of polysilicon.

20. The device of claim 7, wherein the insulating nanowires are of silicon oxide.

21. A structure, comprising:
a seed layer formed above a semiconductor substrate, the seed layer having a notched wall extending transversely with respect to a top surface of the substrate, the wall defining a first recess extending into the seed layer and having a height equal to a thickness of the seed layer;
a first conductive nanowire in contact with the notched wall, the first conductive nanowire having a contact portion that extends into the first recess and covers opposite sidewalls and a bottom of the first recess;
a first insulating nanowire in contact with a sidewall of the first conductive nanowire;
an insulating layer on the contact portion of the first conductive nanowire;
a first window opening in the insulating layer and substantially in correspondence with the contact portion of the first conductive nanowire; and
a first conductive die on the insulating layer, the first conductive die including a conductive contact that extends into the first window and contacts the contact portion of the first conductive nanowire.

22. The structure of claim 21, wherein the notched wall defines a second recess extending into the seed layer and having a height equal to the thickness of the seed layer, the first conductive nanowire extends into the second recess and contacts sidewalls of the second recess, and the second insulating nanowire extends into the second recess and contacts sidewalls of the first conductive nanowire.

23. The structure of claim 22, further comprising:
a second conductive nanowire in contact with a sidewall of the first insulating nanowire, the second conductive nanowire having a contact portion that extends into the second recess and fills the second recess, the insulating layer formed on the contact portion of the second conductive nanowire;
a second insulating nanowire in contact with a sidewall of the second conductive nanowire;
an opening in the insulating layer that comprises a second window substantially in correspondence with the contact portion of the second conductive nanowire; and
a second conductive die on the insulating layer, the second conductive die including a conductive contact that extends into the second window and contacts the contact portion of the second conductive nanowire.

24. The structure of claim 23, wherein the first and second recesses are spaced apart by a distance comprised between 10 nm and 30 nm.

25. The structure of claim 23, wherein the first window is opened by a technique that is either electronic lithography or imprint lithography.

26. The structure of claim 23, wherein the contact portion of the first conductive nanowire has a width comprised between 2 nm and 60 nm.

27. The structure of claim 23, wherein the first window has a width comprised between 2 nm and 60 nm.

28. The structure of claim 23, wherein the seed layer is formed by a lithographic technique.

29. The structure of claim 23, wherein the seed layer is formed by a Multi-spacer Patterning Technology (S"VT).

30. An electronic circuit, comprising
a nanometric circuit architecture;
standard electronic components;
a semiconductor substrate and a seed layer having at least a notched wall substantially perpendicular to the substrate, the wall defining n vertical recesses having a height equal to a thickness of the seed layer, the recesses placed at a distance $b_0$ from one another and having depth $a_n$ and width $b_n$;
n conductive nanowires of thickness $t_{si}$ alternated with insulating nanowires of thickness $(t_{sp}-t_{si})$ wherein $t_{sp}$ is a width of a pair of the conductive and insulating nanowires and, at each realization of one of the conductive nanowires of a given order n, a filling of a corresponding one of the recesses of the same order by a respective elbow-like portion of the conductive nanowire, and a partial filling together with the conductive and insulating nanowires of lower order, of the recesses of greater order by means of respective notched profile portions that form the nanometric circuit architecture;
an insulating layer formed above the nanometric circuit architecture;
n windows in the insulating layer, each window open substantially in correspondence with a respective one of the recesses, with exposure of at least part of the elbow-like portion of a respective one of the conductive nanowires present in the recess; and
n conductive dies formed above the insulating layer and addressed towards the standard electronic components, the conductive dies respectively overlapping in correspondence with the respective windows to respective exposed parts of the respective elbow-like portions of the respective conductive nanowires with obtainment of n contacts realizing the electric connection.

31. The circuit of claim 30, wherein the depth $a_n$ and the width $b_n$ of the seed layer are linked to the thickness $t_{si}$ and $(t_{sp}-t_{si})$ of the nanowires respectively conductive and insulating, by the relation $a_n \geq (n-1)t_{sp}+a_0$ and $b_n=2t_{si}+2(n-1)t_{sp}$.

32. The circuit of claim 30, wherein the n windows have size in a depth direction and in a direction of the width of the recesses equal to $a_0$.

33. The circuit of claim 30, wherein $a_0$ corresponds to the smallest size definable by the technique used for the opening of the windows.

34. The circuit of claim 30, wherein $a_0$ is comprised between 2 nm and 60 nm.

35. The circuit of claim 34, wherein $a_0$ is comprised between 5 nm and 20 nm.

36. The circuit of claim 30, wherein $b_0$ is lower than 60 nm.

37. The circuit of claim 36, wherein $b_0$ is comprised between 10 nm and 30 nm.

38. The circuit of claim 30, wherein the thickness $t_{si}$ of the conductive nanowires is comprised between 5 nm and 60 nm.

39. The circuit of claim 30, wherein the thickness $t_{si}$ of the conductive nanowires is comprised between 5 nm and 30 nm.

40. The circuit of claim 30, wherein the thickness $t_{sp}$ of each pair of consecutive conductive and insulating nanowires is lower than 90 nm.

41. The circuit of claim 30, wherein the thickness $t_{sp}$ of each pair of consecutive conductive and insulating nanowires is comprised between 10 nm and 50 nm.

42. The circuit of claim 30, wherein the conductive nanowires are of polysilicon.

43. The circuit of claim 30, wherein the insulating nanowires are of silicon oxide.

* * * * *

UNITED STATES PATENT AND TRADEMARK OFFICE
CERTIFICATE OF CORRECTION

| | | |
|---|---|---|
| PATENT NO. | : 7,928,578 B2 | Page 1 of 1 |
| APPLICATION NO. | : 12/568508 | |
| DATED | : April 19, 2011 | |
| INVENTOR(S) | : Gianfranco Cerofolini et al. | |

It is certified that error appears in the above-identified patent and that said Letters Patent is hereby corrected as shown below:

Column 8
Claim 8, Line 61, "$b_n$ of the seed layer are linked to the thickness $t_{si}(t_{sp}-t_{si})$ of the" should read as,
--$b_n$ of the seed layer are linked to the thickness $t_{si}$ and $(t_{sp}-t_{si})$ of the--.

Column 9
Claim 16, Line 13, "16. The device of claim 7, wherein the thickness $t_{sp}$ of the" should read as,
--16. The device of claim 7, wherein the thickness $t_{si}$ of the--.

Column 10
Claim 29, line 17, "formed by a Multi-spacer Patterning Technology ($S^n$VT)." should read as,
--formed by a Multi-spacer Patterning Technology ($S^n$PT).--

Signed and Sealed this
Thirty-first Day of May, 2011

David J. Kappos
*Director of the United States Patent and Trademark Office*